Dec. 27, 1955
E. E. CADO
2,728,693
METHOD OF FORMING ELECTRICAL CONDUCTOR
UPON AN INSULATING BASE
Filed Aug. 24, 1953
FIG. 1A
FIG. 1B
FIG. 1C
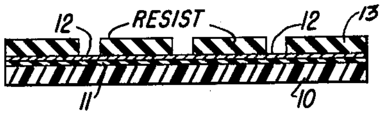
FIG. 1D
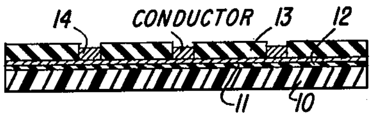
FIG. 1E
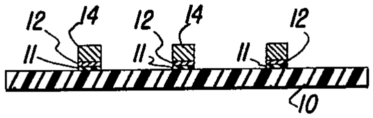
FIG. 1F
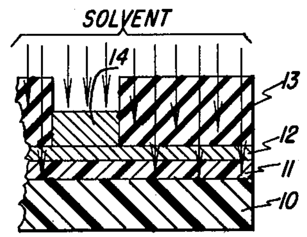
FIG. 2A
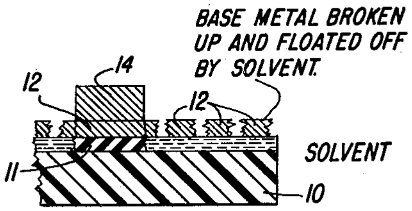
FIG. 2B
FIG. 3A
FIG. 3B
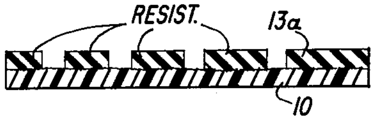
FIG. 3C
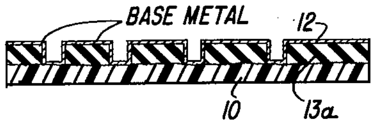
FIG. 3D
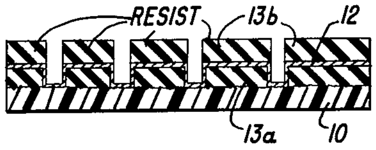
FIG. 3E
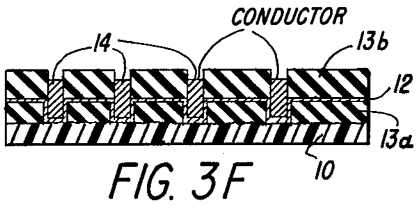
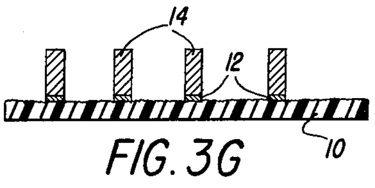
INVENTOR.
ERWIN E. CADO
BY
Forman L. Mueller 2,728,693
Patented Dec. 27, 1955

2,728,693

METHOD OF FORMING ELECTRICAL CONDUCTOR UPON AN INSULATING BASE

Erwin E. Cado, Chicago, Ill., assignor to Motorola, Inc., Chicago, Ill., a corporation of Illinois Application August 24, 1953, Serial No. 376,001
8 Claims. (Cl. 117—212)

The present invention relates to a new improved process for forming electrical conductors upon an insulating base to constitute the chassis of electronic equipment such as a wave signal receiver or the like.

Until recently, the basic technique of manufacturing a radio receiver chassis has remained the same for many years. The usual procedure is to assemble and secure various components such as coils, transformers, tube sockets and the like to a suitably perforated and formed chassis. Thereafter, other smaller components, such as resistors and condensers, which may be supported and secured by their pigtail connections, are connected to various terminals of the chassis, transformers, sockets or the like, by cutting and crimping and soldering their pigtail connections to their respective terminal points. Wires for interconnecting various terminals and socket connections are also cut to length, secured by crimping and then soldered at the terminal points. In recent years, printed circuit techniques have been developed in an effort to reduce the amount of manual labor involved in assembling and wiring a radio receiver.

The usual printed circuit procedure is to apply by printing or coating processes a variegated design of conductive material on a panel of insulating material such as a phenolic condensation product. The conductive material thus formed on the insulating panels establishes the electrical connections between various electrical components that are mounted on the panel and therefore eliminates the wire connections previously used. A suitable process for forming the electrical conductors upon an insulated base is disclosed and claimed in copending application, Serial No. 297,285, filed July 5, 1952, in the name of Temple Nieter and assigned to the present assignee. In the process disclosed in that application, at least one surface of the insulating base is depolished and has a metallic base coating applied thereto. A resist material which is resistant against electrolysis is then screened onto the portions of the metallic base coating upon which no conductors are to appear. A second metallic coating which forms the electrical conductors is then electro-plated onto the remaining portions of the metallic base coating. As a final step in the process, the resist and portions of the metallic base coating covered thereby are removed so that only the second metallic coating and portions of the metallic base coating upon which the second coating is plated remain on the base to constitute the electrical circuit. Some difficulties have been encountered in removing the resist and the portions of the metallic base coating which do not support the final electrical conductors without affecting the electrical conductors themselves.

It is an object of the present invention to provide a new and improved process by means of which the resist and metallic base coatings described above may be removed in a simple and expeditious manner.

A feature of the invention is the provision of an improved process for forming electrical conductors upon an insulating panel by the use of a metallic base coating and resist material, and in which the resist and unwanted portions of the base coating are removed in a simple manner without affecting materially the conductors.

Another feature of the invention is the provision of an improved process for forming electrical conductors on an insulating base in accordance with which a nonconductive base layer is applied over at least portions of a surface of the base, and a base metal coating is applied over the base layer and any portions of the surface not covered thereby, the base metal coating being pervious so that the base layer may be dissolved therethrough by a suitable solvent with the dissolution of the base layer causing the base metal coating to disintegrate and be floated off by the solvent.

The above and other features of the invention which are believed to be new are set forth with particularity in the appended claims. The invention itself, however, together with further objects and advantages thereof, may best be understood by reference to the following description when taken in conjunction with the accompanying drawing in which:

Figures 1*a*–1*f* show various steps illustrative of the process of the present invention;

Figures 2*a* and 2*b* are representations of the dissolution step of the process; and Figures 3*a*–3*g* show a modification of the process.

The present invention provides a method of forming an electrical conductor on an insulating base and comprises the following steps; applying a non-conductive base material over at least portions of at least one surface of the base; applying a pervious metallic coating over the surface of the base at least partially covered by the base material; applying over portions of the pervious metallic coating upon which no conductor is to appear a resist material which is soluble in a common solvent with the base material; applying an impervious metallic coating constituting the desired electrical conductor over the remaining portions of the pervious metallic coating; and applying a solvent to the resist and through the pervious metallic coating to portions of the base material covered by the portions of the pervious metal coating directly under the resist, thereby to dissolve the resist and the last-named portions of the base material and to float off the last-named portions of the pervious metallic coating.

Referring now to the process illustrated in Figures 1*a*–1*f*, Figure 1*a* shows a flat insulating panel 10 which may be composed of a phenolic condensation product or other synthetic resin. It has been found that plastic materials and particularly synthetic plastics having a hard surface must be pretreated so as to reduce the surface to a form adapted to receive and be adhesive to the metallized coating, or an adhesive coating must be applied to the surface.

In the process of Figures 1*a*–1*f*, the surface of the panel 10, upon which the electrical circuit is to be formed, is cleaned and has an adhesive 11 applied thereto such as shown in Figure 1*b*. It is feasible to provide printed circuit conductors on both sides of panel 10, for example, in the manner described in the copending application referred to previously herein. However, for purposes of explanation, the process is illustrated as applied to one surface only of the panel.

The adhesive coating 11 may be applied by spraying, roller-coating or dipping and may be a thermo-setting resin that can be cured by air-dry or temperature and pressure. For example, a thermo-setting resin compound presently marketed by the Synthane Corporation under the designation "Synthane Adhesive No. 1680" has been used satisfactorily and has been applied by dipping or spraying, the resulting adhesive coating being cured for forty-eight hours at room temperature and pressure. Vacuum impregnated alkyd polyester resins have also been used to constitute a satisfactory adhesive layer.

A base metal 12 is then sprayed or otherwise applied over the adhesive layer 11 and this coating may, for example, be silver and may be applied over the adhesive by a dual spray of a silver salt and a salt-reducing solution, the adhesive layer being previously treated with stannous chloride in known manner.

A suitable resist 13 is placed over the portions of the base metal coating 12 on which no final conductor is to appear, this being shown in Figure 1*d*. This resist may, for example, be a highly plasticized unpigmented screening lacquer and this type of resist has been found to be highly satisfactory when the final conductors are applied by electrolytic action. The resist may be placed on the base metal coating by a suitable silk screen such as described in the aforementioned copending application, or by any other suitable means, such as by spraying, roller coating, printing, photographic means or the like.

The next step of the process is shown in Figure 1*e* in which a second metal 14, for example copper, is electroplated over the remaining portions of the base metal 12 to constitute the final total electrical conductor circuit. Alternately, the conductor 14 may be applied to the base metal coating 12 by any other appropriate means such as by vapor condensation such as disclosed in copending application, Serial No. 371,597, filed July 31, 1953, entitled "Plating Process," in the name of Erwin E. Cado, and assigned to the present assignee.

The copper conductors 14 are relatively thick as compared with the base metal coating 12 and, whereas the base metal coating constitutes a pervious structure, the copper conductors constitute an impervious structure. The resultant assembly, therefore, comprises an insulating base 10 with a layer of base material—in this instance, an adhesive layer 11—spread over at least one surface of the base. A relatively thin pervious base metal coating 12, for example silver, is then applied over the base material and a resist 13 is applied over portions of the base metal coating on which no final conductor is to appear. Finally, a second relatively thick metallic coating is formed on the remaining portions of the base metal coating, the second metallic coating being impervious and composed, for example, of copper. It is now necessary to remove the resist 13 and the portions of the metal coating 12 covered thereby. It is also desirable to remove the portions of the adhesive covered by the last mentioned portions of the base metal layer so that only the bare surface of the panel 10 appears between the final conductors so as to exhibit superior electrical characteristics.

As previously stated, the removal of the resist 13 and base metal coating 12 without attacking the final conductors 14 has presented serious problems to the prior art. In accordance with the present process of this invention, these coatings are removed in the manner shown in Figures 2*a* and 2*b*.

The resultant assembly described above is dipped in a solvent such as acetone or methylethylketone, for example, or otherwise treated thereby. When a thermosetting resin adhesive and a lacquer resist are used, these solvents dissolve both the resist and the adhesive. When the assembly is dipped in the solvent, it attacks the various components in the manner shown diagrammatically by the arrows in Figure 2*a*, that is, the solvent enters the resist 13 and dissolves the resist and it also passes through the pervious base metal coating 12 and enters the adhesive 11 under the portions of the base metal coating that are not covered by the final conductors 14. Conductors 14, as previously stated, are impervious to the solvent so that it does not pass through the conductors.

When the solvent passes through the base metal coating 12 into the adhesive thereinunder, it dissolves the adhesive and breaks up and floats off the portions of the base metal coating that are not covered by the final conductors 14. It has been found that the solvent is capable of dissolving the adhesive under the portions of the base metal coating that are not covered by the final conductors 14, and of floating off these portions without materially affecting the adhesive under the portions of the base metal coating covered by the final conductor or of attacking the latter portions of the base metal coating.

The final assembly is shown in Figure 1*f* which comprises the insulating base 10 which has been cleaned completely of resist and portions of the base metal coating 12 and adhesive 11 lying between the final conductors 14. The conductors 14, however, are firmly retained on the base by the remaining portions of the base metal coating 12 and adhesive layer 11. This final assembly has been found to exhibit highly satisfactory characteristics in that it has been found that the final conductors are firmly retained on the insulating panel and the intervening spaces between the conductors are absolutely free of extraneous or foreign matter so that the assembly exhibits satisfactory electrical characteristics even in the presence of moisture. This latter feature is due to the fact that only the highly insulating bare surface of the panel 10 appears between the final conductors.

Another embodiment of the invention is shown in Figures 3*a*–3*g*. In this latter embodiment, the insulating panel 10, shown in Figure 3*a*, has at least one surface roughened or depolished by sandblast or other suitable means, as shown in Figure 3*b*. The next step in the process is shown in Figure 3*c* in which a first layer of resist **13*a* is placed directly on the depolished surface of base 10 over portions of that surface on which no final conductor is to appear. The base metal coating 12 is then placed over the surface of the panel 10 covered by layer 13*a*, and the base metal coating covers the layer 13*a* and other portions of the surface of base 10 that are not covered by the layer of resist. The resist 13*a* may be applied to the depolished surface of base 10 by silk screening or by any other suitable means as previously noted, and the base coating 12** may be applied over the layer of resist by spraying or any other means as pointed out in the description of the previous embodiment.

A second layer of resist **13*b* is then placed directly over the first layer 13*a* to cover only the portion of the base coating 12 on which no final conductors are to appear. It has been found that the resist layer 13*a* can be impressed on the base 10 and the resist layer 13*b*** impressed directly thereover by two subsequent silk screening steps and that satisfactory registration can be achieved between the two resist layers without any undue difficulty.

The final conductors 14 are then formed on the base 10 by electrolytic or other means and then these conductors appear only on the portions of the base metal coating 12 that are not covered by the resist layer **13*b***.

As before, the base metal coating 12 is relatively thin and is pervious to a solvent; whereas the conductors 14 are formed by a relatively thick metal layer and are impervious to solvent. When a lacquer resist is used, the type of solvents referred to previously herein may then be utilized to dissolve the resist layer **13*b* and to pass through the base metal coating 12 to dissolve the resist layer 13*a*. The solvent floats off the portions of the base metal coating 12** interposed between the resist layers in a manner similar to that shown in Figure 2*b*, leaving the assembly of Figure 3*g*.

It is obvious that many different types of materials can be used to constitute the resist and base material layers, it being desirable that both these layers are soluble in a common solvent. However, that is not essential, for a first solvent may be used to dissolve the resist layer 13 in the first embodiment and **13*b* in the second embodiment, and a second solvent may be used to dissolve the base material layer 11 in the first embodiment and 13*a*** in the second embodiment. When so desired, the resultant assemblies of Figure 1*e* or 3*f* may be placed in a vapor degreaser using trichloroethylene. The latter functions as a solvent and dissolves the lacquer resists and passes through the porous or pervious base metal coating to dissolve the thermo-setting resin adhesive or second lacquer resist layer. In each instance, the solvent has been found not only to dissolve the non-conductive layer of base material, but also to break up and float off the portion of the base metal coating interposed between the resist and base material.

The invention provides, therefore, a simplified process for forming printed electrical circuits on an insulating panel in accordance with which portions of the base metal layer and the resist are removed in a simplified manner without affecting the electrical conductors.

While particular embodiments of the invention have been shown and described, modifications may be made and it is intended in the appended claims to cover all such modifications as fall within the true spirit and scope of the invention.

I claim:

1. A method of forming an electric conductor on an insulating base which comprises the following steps, applying a soluble non-conductive base material over at least portions of at least one surface of the base, applying a pervious metallic coating over the surface of the base at least partially covered by said base material, forming a soluble resist over the portions of said metallic coating upon which no conductor is to appear, applying an impervious metallic coating over the remaining portions of said pervious metallic coating, and dissolving said resist and portions of said base material covered by the portions of said pervious metallic coating directly under said resist and floating off said last named portions of said pervious metallic coating.

2. A method of forming an electric conductor on an insulating base which comprises the following steps, applying a soluble non-conductive base material over at least portions of at least one surface of the base, spraying a relatively thin pervious metallic coating over the surface of the base at least partially covered by said base material, forming a soluble resist over the portions of said metallic coating upon which no conductor is to appear, depositing a relatively thick impervious metallic coating over the remaining portions of said pervious metallic coating, and dissolving said resist and portions of said base material covered by the portions of said pervious metallic coating directly under said resist and floating off said last named portions of said pervious metallic coating.

3. A method of forming an electric conductor on an insulating base which comprises the following steps; applying a non-conductive soluble base material over at least portions of at least one surface of the base, spraying a relatively thin pervious silver coating over the surface of the base at least partially covered by said base material, forming a soluble resist material resistant to electrolytic action over the portions of said silver coating upon which no conductor is to appear, electro-depositing a relatively thick impervious copper coating over the remaining portions of said silver coating, and dissolving said resist and portions of said base material covered by the portions of said silver coating directly under said resist and floating off said last named portions of said pervious metallic coating.

4. A method of forming an electric conductor on an insulating base which comprises the following steps; applying a soluble adhesive material over at least one surface of the base, applying a pervious metallic coating over said adhesive, forming a soluble resist over the portions of said metallic coating upon which no conductor is to appear, applying an impervious metallic coating over the remaining portions of said pervious metallic coating, and dissolving said resist and portions of said adhesive covered by the portions of said pervious metallic coating directly under said resist and floating off said last named portions of said pervious metallic coating.

5. A method of forming an electric conductor on an insulating base which comprises the following steps; applying a non-conductive soluble base material over at least portions of at least one surface of the base, applying a pervious metallic coating over the surface of the base at least partially covered by said base material, forming over portions of said pervious metallic coating upon which no conductor is to appear a resist soluble in a common solvent with said base material, applying an impervious metallic coating over the remaining portions of said pervious metallic coating, and applying a solvent to said resist and through said pervious metallic coating to portions of said base material covered by portions of said pervious metallic coating directly under said resist, thereby to dissolve said resist and said last named portions of said base material and to float off said last named portions of said pervious metallic coating.

6. A method of forming an electric conductor on an insulating base which comprises the following steps; applying a soluble adhesive material over at least one surface of the base, applying a pervious metallic coating over said adhesive material, forming over portions of said pervious metallic coating upon which no conductor is to appear a resist soluble in a common solvent with said adhesive material, applying an impervious metallic coating over the remaining portions of said pervious metallic coating, and applying a solvent to said resist and through said pervious metallic coating to portions of said adhesive material covered by portions of said pervious metallic coating directly under said resist, thereby to dissolve said resist and said last named portions of said adhesive material and to float off said last named portions of said pervious metallic coating.

7. A method of forming an electric conductor on an insulating base which comprises the following steps, applying a first layer of soluble resist material over portions of at least one surface of said base on which no conductor is to appear, applying a pervious metallic coating over said layer of resist material and over the remaining portions of said surface of said base, forming a second layer of soluble resist material over the portions of said pervious metallic coating covering said first named layer of resist material, applying an impervious metallic coating over the remaining portions of said pervious metallic coating, and dissolving said first and second layers of resist material and floating off the portions of said pervious metallic coating separating said first and second layers.

8. A method of forming an electric conductor on an insulating base which comprises the following steps, applying a first layer of soluble resist material directly over portions of at least one surface of said base on which no conductor is to appear, applying a pervious metallic coating over said layer of resist material and over the remaining portions of said surface of said base, forming a second layer of said resist material over the portions of said pervious metallic coating covering said first layer, applying an impervious metallic coating over the remaining portions of said pervious metallic coating, and applying a solvent to said second layer of resist and through said pervious metallic coating to said first layer of resist, thereby to dissolve said first and second layers of said resist material and to float off the portions of said pervious metallic coating separating said first and second layers.

References Cited in the file of this patent

UNITED STATES PATENTS

| | | |
|---|---|---|
| 2,443,119 | Rubin | June 8, 1948 |
| 2,447,836 | Beeber et al. | Aug. 24, 1948 |

OTHER REFERENCES

Monack: "Metallizing Glass and Ceramic Materials," The Glass Industry, January 1947, pp. 21, 22, 23, 24, 25, 40, 42, 43 and 44.

Printed Circuit, National Bureau of Standards, Circular No. 468, November 15, 1947, pp. 21 to 27.